US007504126B2

(12) United States Patent
Nishitani et al.

(10) Patent No.: US 7,504,126 B2

(45) Date of Patent: Mar. 17, 2009

(54) PLASMA DISPLAY PANEL MANUFACTURING METHOD FOR IMPROVING DISCHARGE CHARACTERISTICS

(75) Inventors: Mikihiko Nishitani, Nara (JP); Yukihiro Morita, Hirakata (JP); Masatoshi Kitagawa, Hirakata (JP); Masaharu Terauchi, Nara (JP)

(73) Assignee: Panasonic Corporation, Osaka (JP)

( * ) Notice: Subject to any disclaimer, the term of this patent is extended or adjusted under 35 U.S.C. 154(b) by 29 days.

(21) Appl. No.: 11/486,185

(22) Filed: Jul. 13, 2006

(65) Prior Publication Data

US 2006/0251799 A1 Nov. 9, 2006

Related U.S. Application Data

(62) Division of application No. 10/702,841, filed on Nov. 6, 2003, now Pat. No. 7,102,287.

(30) Foreign Application Priority Data

Nov. 18, 2002 (JP) ............................ 2002-333908
May 12, 2003 (JP) ............................ 2003-133076

(51) Int. Cl.
*B05D 5/06* (2006.01)
*C23C 14/14* (2006.01)

(52) U.S. Cl. ...................... 427/68; 427/372.2; 427/531; 427/535; 427/539

(58) Field of Classification Search .................. 427/64, 427/68, 372.2, 531, 535, 539
See application file for complete search history.

(56) References Cited

U.S. PATENT DOCUMENTS 4,053,804 A 10/1977 Aboelfotoh
4,297,613 A 10/1981 Aboelfotoh
4,475,060 A * 10/1984 Aboelfotoh ................. 313/587
5,454,861 A 10/1995 Hasegawa et al.
6,017,579 A * 1/2000 Kano et al. .............. 427/126.2
6,242,864 B1 6/2001 Nakahara et al.
2005/0264211 A1 12/2005 Kim
2006/0038495 A1 2/2006 Lee et al.

FOREIGN PATENT DOCUMENTS

| | | |
|---|---|---|
| EP | 0064149 | 3/1982 |
| EP | 0881657 | 12/1998 |
| JP | 2001-332175 | 5/2000 |
| JP | 2001-076629 | 3/2001 |
| JP | 3247632 | 11/2001 |
| JP | 2002-075221 | 3/2002 |
| JP | 2002-093317 | 3/2002 |

* cited by examiner

OTHER PUBLICATIONS

Rosenblatt G H et al: "Luminescence of F and F<+> centers in magnesium oxide" Physical Review B (Condensed Matter) USA vol. 39, No. 14, May 15, 1989, pp. 10309-10318, ISN: 0163-1829.

*Primary Examiner*—Timothy H Meeks
*Assistant Examiner*—Jimmy Lin

(57) ABSTRACT

A plasma display panel is composed of a first substrate and a second substrate facing each other via a discharge space and sealed together. A protective layer on the first substrate is composed principally of magnesium oxide, includes a substance or structure that creates a first energy level in an area of a forbidden band, the area being in a vicinity of a conduction band, and includes a substance or structure that creates a second energy level in another area in the forbidden band, the other area being in a vicinity of a valence band. During driving the second energy level is occupied by electrons, and few electrons exist in the first energy level, or electrons can easily occupy the first energy level due to a minus charge state, and MgO insultaive resistance is not lowered. This maintains wall charge retention and reduces discharge irregularities and firing voltage Vf.

7 Claims, 8 Drawing Sheets

PLASMA DISPLAY PANEL MANUFACTURING METHOD FOR IMPROVING DISCHARGE CHARACTERISTICS

CROSS-REFERENCE TO RELATED APPLICATIONS

This is a divisional application of U.S. Ser. No. 10/702,841, filed on Nov. 6, 2003, now U.S. Pat. No. 7,102,287.

BACKGROUND OF THE INVENTION (1) Field of the Invention

The present invention relates to a plasma display panel and a manufacturing method therefor, and in particular to a method for forming a magnesium oxide protective layer that covers a dielectric layer.

(2) Description of Related Art

A plasma display panel (hereinafter referred to as a "PDP") is a gas discharge panel in which images are displayed according to phosphor that emits light by being excited by ultraviolet rays generated by gas discharge. PDPs are divided into two types: alternating current (AC) and direct current (DC), depending of the method used to discharge. AC PDPs are the more common type due to their superiority over DC PDPs in terms of luminance, luminous efficiency, and lifespan.

An AC PDP has the following structure. A plurality of electrodes (display electrodes and address electrodes) are arranged on each of two thin sheets of panel glass. The exposed parts of the surface of each sheet of glass and the electrodes are covered by a dielectric layer on which a protective layer (film) is formed. The sheets of glass are positioned and sealed together facing each other via a plurality of barrier ribs, between each pair of which is a phosphor layer. As a result, discharge cells (sub-pixels) are formed in a matrix pattern. Discharge gas is enclosed in the space formed between the two sheets of panel glass.

When the PDP is driven, electricity is supplied appropriately to the plurality of the electrodes based on a field time division gradation display method, in order to obtain discharge in the discharge gas, thereby generating ultraviolet rays that illuminate the phosphor. Specifically, each frame to be displayed is divided into a plurality of subfields, and each subfield is further divided into a plurality of periods. In each frame, first the wall charge of the whole screen is initialized (reset) in an initialization period. Then, in an address period address discharge is performed in order to charge the walls only of cells to be illuminated. Next, in a discharge sustain period an AC voltage (sustain voltage) is applied simultaneously to all discharge cells to obtain sustained discharge for a set period of time. Since discharge in a PDP occurs based on a probability phenomenon, the probability that discharge will occur (called "discharge probability") varies from cell to cell. Consequently, this characteristic allows the discharge probability of, for example, address discharge to be increased in proportion to the width of the pulse applied to execute address discharge.

An example of a general structure of a PDP is disclosed in Japanese Laid-Open Patent Application No. 9-92133.

Here, the purpose of the protective layer that covers the dielectric layer on the panel glass on the front side of the PDP is to protect the dielectric layer from ion bombardment during discharge, and also to function as a cathode material that contacts the discharge space. As such, it is commonly known that the properties of the protective layer influence discharge characteristics significantly. In the aforementioned document, an MgO material is selected for use as the protective layer because of the fact that firing voltage Vf can be lowered due to the large secondary emission coefficient of MgO, and that MgO is resistant to sputtering. An MgO protective layer is usually formed with a thickness of approximately 0.5 μm to 1 μm by vacuum deposition.

Although MgO is used in the protective layer in a PDP in order lower the firing voltage Vf, the operation voltage is still higher than, for example, a liquid crystal display apparatus, and it is necessary for the transistors and driver ICs used in the driving circuits and the integrated circuits to be highly voltage resistant. This is one factor that contributes to the high cost of PDPs.

More specifically, expectations in recent years for higher definition and larger size of displays has lead to increases in the number of cells, and consequently a need to increase the driving speed of PDPs. Demands are being made to reduce the time assigned to each subframe as a way of shortening driving time. When the driving time is shortened, the discharge probability decreases, and therefore the possibility increases of discharge, such as address discharge, not being performed reliably. One method that attempts to deal with this problem is dual scanning. To achieve dual scanning, the number of data driver ICs in the driving circuit is increased, and address discharge is performed simultaneously from both the top and bottom of the panel towards the center, to achieve what appears to be an address period of a set length of time. However, if this method is employed, the number of data drivers required is twice that of an ordinary PDP and wiring becomes complicated. These factors contribute to high costs and low yield in manufacturing PDPs.

As a result, there is a desire to produce PDPs that consume less power by being driven with low voltage, while controlling the cost of the PDPs.

Examples of techniques for driving of a PDP with low power consumption are disclosed in Japanese Laid-Open Patent Application No. 2001-332175 and Japanese Laid-Open Patent Application No. 10-334809. Such techniques involve creating an energy level in a forbidden band in a vicinity of a conduction band (C.B) by providing an oxygen vacancy defect in the MgO of the protective layer or doping the MgO with impurities. This enables the firing voltage Vf to be lowered, and improves discharge characteristics (in particular, discharge irregularities). FIG. 7 shows the relationship between the energy state of the MgO of the protective layer and the discharge space in the prior art. In the prior art, a first energy level 31 is provided in a vicinity of the conduction band of the protective layer by, for instance, doping the MgO with silicon, as shown in FIG. 7. This increases the number of electrons that are excited in the protective layer during driving, and enables electrons to be supplied to the discharge space more easily, thereby increasing the discharge probability. In FIG. 7, Eg shows the band gap of the MgO, which is 7.8 eV, and Ea shows the electron affinity of the MgO, which is 0.85 eV.

However, the conventional techniques are problematic in that they are unable to both reduce the firing voltage Vf sufficiently and solve display instability called "black noise". Black noise is a phenomenon where a cell that should be illuminated (a selected cell) is not illuminated, and tends to occur at the boundaries between illuminated areas and non-illuminated areas. Black noise does not occur in all of a plurality of selected cells in one line or one column, but is scattered across the screen. For this reason, black noise is thought to be caused by address discharge either lacking in intensity or failing to occur. This is thought to be caused by the power of the walls to retain charge being reduced, and the effective addressing voltage consequently dropping, if the firing voltage Vf is lowered by simply providing an energy level in a vicinity of the conduction band in the forbidden band of the MgO. As a result, errors occur in addressing, and the image display performance of the PDP is reduced.

SUMMARY OF THE INVENTION

In view of the stated problems, the object of the present invention is to provide a PDP, and a manufacturing method therefor, that is able to increase discharge probability by reducing firing voltage Vf without using expensive, highly voltage-resistant transistor and driver ICs, and that has a protective layer that is able to reduce the occurrence of black noise in which cells that should be illuminated are not illuminated, by maintaining wall charge retention.

In order to solve the stated problems, the present invention is a plasma display panel composed of a first substrate and a second substrate that are arranged facing each other via a discharge space and sealed together at edge portions, the first substrate having a protective layer being formed on a main surface thereof that faces the second substrate, wherein the protective layer is composed principally of magnesium oxide, includes a substance or a structure that creates a first energy level in an area of a forbidden band, the area being in a vicinity of a conduction band, and includes a substance or a structure that creates a second energy level in another area in the forbidden band, the other area being in a vicinity of a valence band.

Specifically, in the plasma display panel, discharge irregularities and firing discharge voltage are controlled due to the existence of the first energy level, and firing voltage is controlled and wall charge is retained due to the existence of the second energy level.

BRIEF DESCRIPTION OF THE DRAWINGS

These and other objects, advantages and features of the invention will become apparent from the following description thereof taken in conjunction with the accompanying drawings which illustrate a specific embodiment of the invention. In the drawings.

DESCRIPTION OF PREFERRED EMBODIMENTS

1. First Embodiment

1-1. Structure of the PDP

Figure 1:
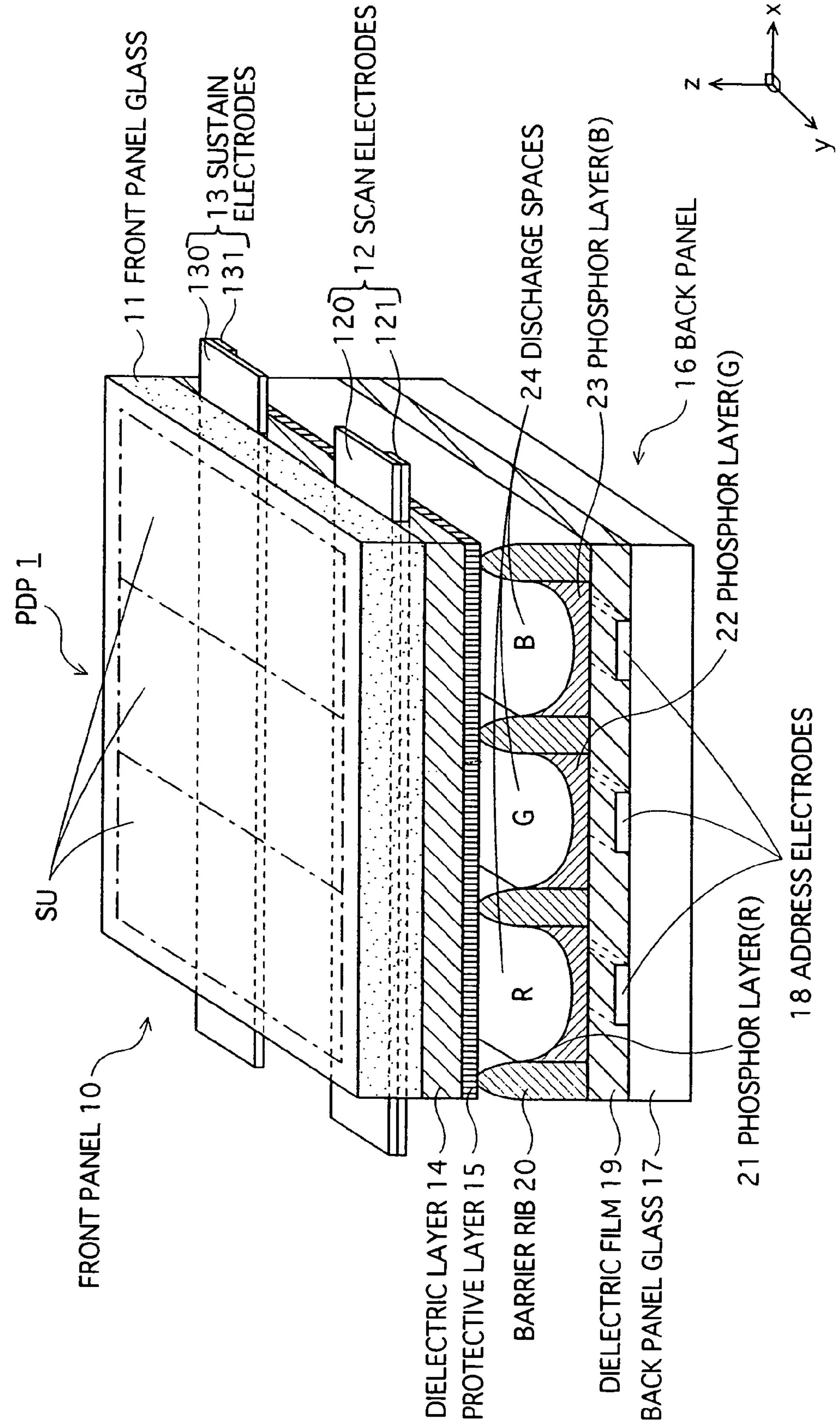
FIG. 1 is cross-sectional perspective view that shows the structure of a PDP of the first embodiment schematically.

FIG. 1 is a cross-sectional perspective drawing partially showing relevant structure of an AC PDP 1 of the first embodiment of the present invention. In FIG. 1, a z direction corresponds to a thickness direction of the PDP 1, and an xy plane corresponds to a plane parallel to a panel surface of the PDP 1. Here, as one example, the PDP 1 is a 42-inch class NTSC PDP. However, the present invention may be applied to other specifications such as XGA (extended graphic array) and SXGA (super extended graphics array), and other sizes.

As shown in FIG. 1, the structure of the PDP 1 can be divided broadly into a front panel 10 and a back panel 16, which are arranged with their respective main surfaces opposing each other.

The front panel 10 includes a sheet of front panel glass 11 that has a plurality of pairs of display electrodes 12 and 13 formed on one main surface thereof (each pair being composed of a scan electrode 12 and a sustain electrode 13). Each of the scan electrodes 12 is made up of a band-shaped transparent electrode 120 and a bus line 121, and each of the sustain electrodes 13 is made up of a band-shaped transparent electrode 130 and a bus line 131. The transparent electrodes 120 and 130 are 0.1 μm thick and 150 μm wide, and made from a transparent conductive material such as ITO or $SnO_2$. The bus lines 121 and 131 which are laminated on the transparent electrodes 120 and 130, respectively, are 95 μm wide, and made of, for example, Ag film (2 μm to 10 μm thick), thin Al film (0.1 μm to 1 μm thick), or Cr/Cu/Cr laminated film (0.1 μm to 1 μm thick). The bus lines 121 and 131 lower the sheet resistance of the transparent electrodes 120 and 130.

A dielectric layer 14 is formed using screen printing on the main surface of the front panel glass 11 on which the display electrodes 12 and 13 are disposed, so that the display electrodes 12 and 13 and the exposed parts of the main surface are covered. The dielectric layer 14 is 20-μm to 50-μm thick glass with a low-melting point glass, and has lead oxide (PbO), bismuth oxide ($Bi_2O_3$), or phosphate ($PO_4$) as a main component. The dielectric layer 14 has a current restricting function that is characteristic to AC PDPs, and contributes to enabling AC PDPs to have a longer lifespan that DC PDPS. The surface of the dielectric layer 14 is coated with a protective layer 15 that is approximately 1.0 μm thick.

The structure of the protective layer 15 which is the characteristic feature of the present first embodiment is discussed in detail later.

In the back panel 16, a plurality of address electrodes 18 are provided on a main surface of a sheet of back panel glass 17. Each address electrode 18 is 60 μm wide, and is made of, for example, Ag film (2 μm to 10 μm thick), thin Al film (0.1 μm to 1 μm thick), or Cr/Cu/Cr laminated film (0.1 μm to 1 μm thick). The address electrodes are arranged in a stripe formation, the x direction being the lengthwise direction, at set intervals (360 μm) in the y direction. The main surface of the back panel glass 17 is coated with a 30-μm thick dielectric layer 19 so as to cover the exposed parts of the glass 17 and the address electrodes 18. Barrier ribs 20 (150 μm high, 40 μm wide) are arranged on the dielectric layer 19 is positions corresponding to the gaps between the address electrodes 18, with each pair of neighboring barrier ribs 20 partitioning subpixels SU from each other. The barrier ribs 20 serve to prevent erroneous discharge, optical crosstalk, and the like in the x direction. Phosphor layers 21 to 23, which correspond respectively to red (R), green (G), and blue (B) used to achieve color display, are formed on the surfaces of the sides of the barrier ribs 20 and on the dielectric layer 19 between the barrier ribs 20.

Note that it is possible to cover the address electrodes 18 with the phosphor layers 21 to 23 directly, without using the dielectric layer 19.

The front panel 10 and the back panel 16 are arranged facing each other such that the lengthwise direction of the address electrodes 18 and the display electrodes 12 and 13 cross, and the edges of the front panel 10 and the front panel 16 are sealed together with glass frit. A discharge gas (enclosed gas) composed of an inert gas such as He, Xe, and Ne is inserted with a predetermined pressure (ordinarily, approximately 53.2 kPa to 79.8 kPA) in the space formed between the sealed panels 10 and 16.

Each space between neighboring barrier ribs 20 is a discharge space 24. Each area where a pair of display electrodes 12 and 13 cross so as to sandwich part of the discharge space 24 corresponds to a subpixel SU for image display. Each cell has a pitch of 1080 μm in the x direction and 360 μm in the y direction. Three neighboring subpixels, specifically an red subpixel, a green subpixel, and a blue subpixel, compose one pixel (1080 μm by 1080 μm).

1-2 Basic Operations of the PDP

The PDP 1 having the above-described structure is driven by a driving unit (not illustrated) that supplies electricity to the display electrodes 12 and 13 and the address electrodes 18. When driving the PDP 1 in order to have an image displayed, an AC voltage of several tens of kHz to several hundreds of kHz is applied between pairs of display electrodes 12 and 13, thereby causing discharge in the subpixels SU. The discharge excites Xe electrons which emit ultraviolet rays, and the ultraviolet rays excite the phosphor layers 21 to 23 which consequently emit visible light.

At this time, the driving unit controls light emission in each cell according to binary control, i.e. each cell is either on or off. Gradations in color are expressed by dividing each frame F of a time series of an image input by an external apparatus into subframes. Taking an example where the total number of subfields is six, the number of times that illumination for sustain discharge is performed in each subframe is set by weighting the subfields so as to have, for instance, a luminance ratio 1:2:4:8:16:32.

Figure 2:
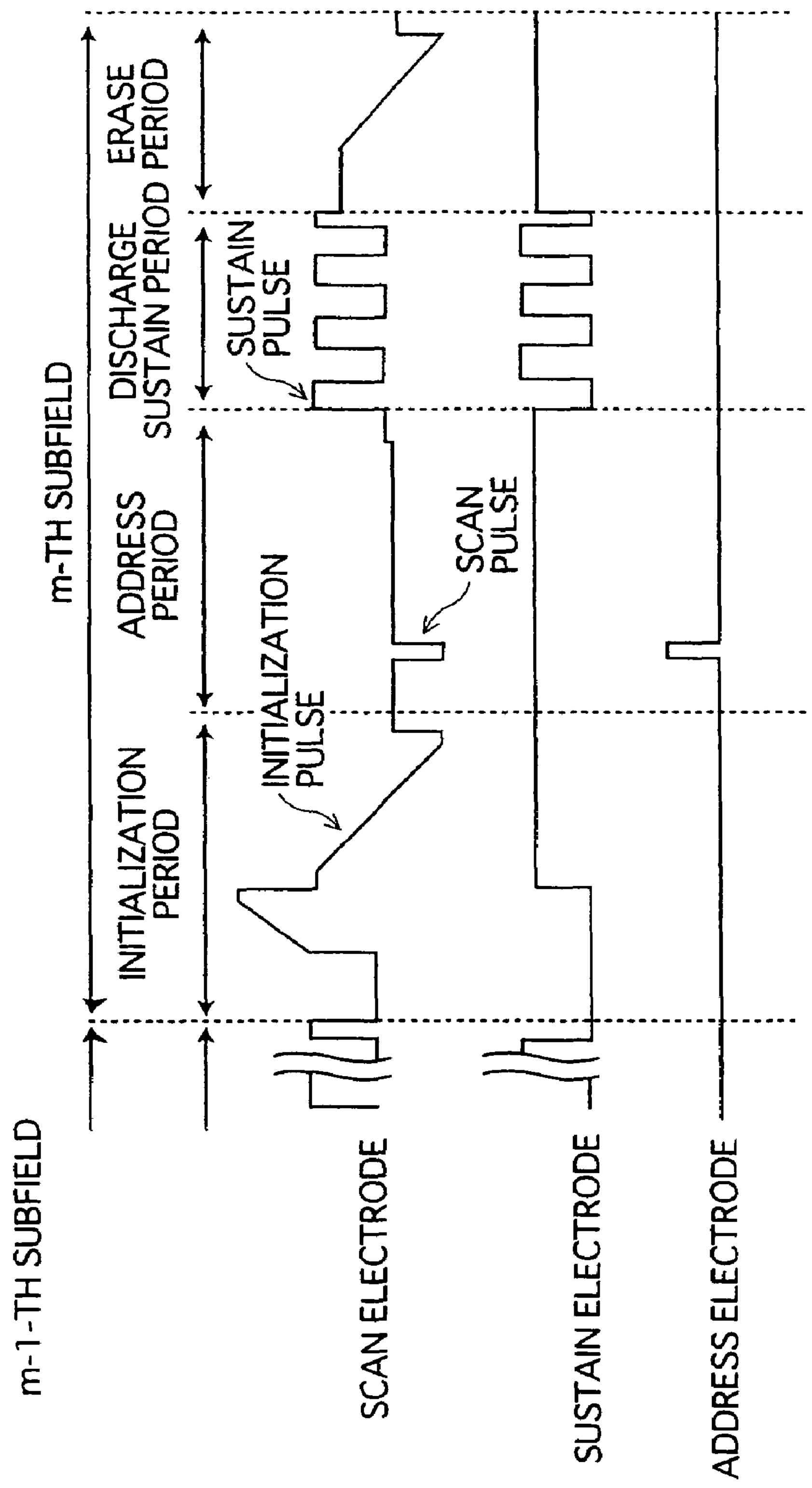
FIG. 2 shows an example of a PDP driving process.

FIG. 2 shows an example of a drive waveform process of the PDP 1. Specifically, FIG. 2 shows an m-th subframe of a frame. Each subframe is assigned an initialization period, an address period, a discharge sustain period, and an erase period as shown in FIG. 2.

The initialization period is for erasing wall charge of the whole screen (initialization discharge) in order to prevent influence by previous illumination in the cell (due to accumulated wall charge). As shown in FIG. 2, a positive reset pulse that has a down-ramp shape and that exceeds the firing voltage Vf is applied to all the display electrodes 12 and 13. At the same time, a positive pulse is applied to all the electrodes 18 in order to prevent electrical charge and ion bombardment in the back panel 16 side. Weak discharge occurs in all cells due to the differential voltage between the rising edge and the falling edge of the pulse, and wall charge is stored in all cells Consequently, the state of charge is uniform across the whole screen.

The address period is for addressing (setting illumination/non-illumination) selected cells based on an image signal divided into subframes. In the address period, the scan electrodes 12 are biased to have positive potential and all the sustain electrodes 13 are biased to have negative potential relative to ground potential. While the display electrodes 12 and 13 are in this state, lines (horizontal series of cells that correspond to a pair of display electrodes) are selected successively starting from the top of the panel, and a negative scan pulse is applied to the selected scan electrodes 12. Furthermore, a positive scan pulse is applied to the address electrodes 18 that correspond to cells to be illuminated. Weak surface discharge is carried over from the initialization period due to the pulses being applied, and address discharge occurs and wall charge is stored only in the cells to be illuminated.

The discharge sustain period is for expanding the illumination state set by address discharge, and sustaining discharge, in order to obtain luminosity corresponding to gradation levels. Here, to prevent unnecessary discharge, all address electrodes 18 are biased to positive potential, and a positive sustain pulse is applied to all sustain electrodes 13. A sustain pulse is then alternately applied to the scan electrodes 12 and the sustain electrodes 13, and discharge repeated for a predetermined period.

The erase period is for applying a decremental pulse to the scan electrodes 12 in order to erase wall charge.

Note that each of the initialization period and the address period is of a set length regardless of luminous weight, but the discharge sustain period is longer the greater the luminous weight. In other words, the length of the display period is different in each subframe.

According to the discharge in each subframe in the PDP 1, Xe causes vacuum ultraviolet rays made up of resonance lines having a sharp peak at 147 nm and of molecular beams with a center of 173 nm to be generated. The phosphor layers 21 to 23 are irradiated with the vacuum ultraviolet rays, and generate visible light. Multiple colors and gradations are displayed according to combinations of red, green, and blue in each subframe.

1-3. Protective Layer of the First Embodiment

Figure 3:
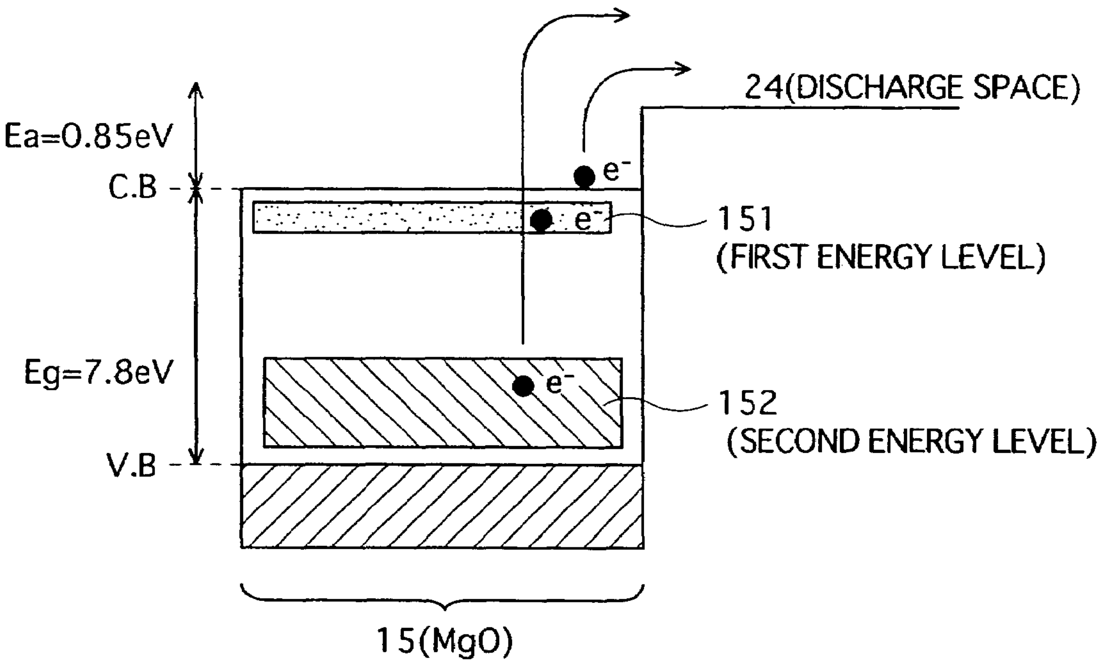
FIG. 3 shows the relationship between the energy state in MgO of a protective layer and a discharge space in the first embodiment of the present invention.

The main characteristic of the first embodiment is the use of MgO having energy levels such as shown in the energy diagram in FIG. 3 as the protective layer 15. In other words, in the first embodiment, the protective layer 15 is MgO that has, in addition to a first energy level 151 in a vicinity of the conduction band (C.B), a second energy level 152 is provided in a vicinity of the valence band (V.B) in the forbidden band. Looking at the protective layer 15 in terms of a semiconductor, the first energy level 151 can be said to have a donor-like property that emits electrons easily, and the second energy level 152 can be said to have an acceptor-like property that retains electrons easily.

By using this kind of structure, the protective layer 15 lowers the firing voltage Vf and improves discharge probability with the first energy level 151, and prevents black noise by retaining wall charge with the second energy level 152.

Specifically, according to the protective layer 15 with the stated structure, when the PDP 1 is driven (in the initialization period, for example), electricity is supplied to the display electrodes 12 and 13, and when a positive pulse with a down-ramp waveform is applied to the scan electrodes 12, the discharge gas is excited, and plasma (here, initialization discharge) is generated in the discharge space 24. Visible light is emitted having an emission wavelength of around 700 nm, corresponding to the difference in energy in the excitement of the electrons and the ground state.

In the MgO of the protective layer 15 during driving, electrons can easily exist in first energy level 151 provided in a vicinity of the conduction band due to the state of negative charge, therefore the number of excited electrons increases and electrons can be easily supplied to the discharge space 24. This enables the discharge irregularities and the discharge staring voltage Vf to be reduced, as well as achieving favorable discharge probability.

Conversely, the second energy level 152 provided in a vicinity of the valence band is in a state in which it receives electrons that were originally retained by the first energy level. Due to the electrons existing in the second energy level, the protection layer is able to sufficiently retain wall charge, and the firing voltage Vf can be reduced. Consequently, since the conventional problem of insulation resistance of the MgO being lowered is controlled, the phenomenon of cells that should illuminate not illuminating, in other words, black noise, can be prevented effectively.

In the present invention, vacancies and dopants (impurities) are used in the MgO crystals in order to create the first and second energy levels, respectively.

Table 1 shows respective vacancies and elements used as dopants to form the first and second energy levels in the forbidden layer of the MgO. As shown in Table 1, the first embodiment can be achieved by certain combinations of the vacancies and elements, or in some cases by co-doping the MgO with a plurality of types of elements. The combinations shown in Table 1 were discovered as a result of careful investigation by the inventors.

TABLE 1

| First energy level | Second energy level |
|---|---|
| Oxygen vacancy | Mg vacancy |
| Group III element | Group I element |
| Group IV element | Group V element |
| Group VII element | |

The first energy level in the MgO may be created by providing an oxygen vacancy defect in the MgO crystals, or including a Group III element such as B, Al, Ga or In, a Group IV element such as Si, Ge, Sn, or a Group VII element such as F, Cl, Br, or I, in the MgO crystals. Furthermore, the second energy level may be created in the MgO by providing an oxygen vacancy defect in the MgO crystals, or by including a Group I element such as Na, K, Cu, or Ag (but not hydrogen (H)), or a Group V element such as N (nitrogen), P, As, or Sb.

The following are combinations of structures of the first and second energy levels that may be used in the present embodiment.

A. The first energy level is created by an oxygen vacancy defect, and the second energy level is created by and Mg vacancy defect.

B. The first energy level is created by an oxygen vacancy defect, and the second energy level is created by chromium.

C. The first energy level is created by silicon, and the second energy level is created by an oxygen vacancy defect.

Although silicon and oxygen vacancy are both ordinarily used for creating a first energy level, silicon creates a level closer to the conduction band, and therefore combination C effectively results in silicon creating the first energy level and the oxygen vacancy defect creating the second energy level.

D. The first energy level is created by an oxygen vacancy defect, and the second energy level is created by a Group I element other than hydrogen, or a Group V element.

Note that the oxygen vacancy defect may be created by providing an Mg-rich composition in the MgO extending from the surface that faces the discharge space 24 for a depth of at least 100 nm. Here, a thickness of at least 100 nm is selected so as to be greater than the thickness thought to be required considering wear of the protective layer when the PDP is illuminated in an ordinary lifespan.

Note that if used as a dopant in combination D, hydrogen acts as the first energy level for reasons described later.

E. The first energy level is created by a Group III, IV, or VII element, and the second energy level is created by an Mg vacancy defect.

Note that in combination E, the Mg vacancy defect may be created by oxygen-rich MgO, and the transition metal chromium (Cr) may be used as an additional dopant to provide luminescent centers. The effects of Cr as luminescent centers are described in detail in the second embodiment. As with combination D, it is preferable that a protective layer including this kind of Mg vacancy defect and Cr be formed with a depth of at least 100 nm from the surface that faces the discharge space 24.

Furthermore, in combination E, if the dopant is either hydrogen or the Group IV element silicon, the hydrogen or silicon acts as a reserver of electrons excited to near the conduction band, and lifespan of visible light emission from the luminescent centers can be extended.

F. The first energy level is created by a Group VII element, and the second energy level is created by a Group I element other than hydrogen, or a Group V element.

G. The first energy level is created by a Group III, IV, or VII element, and the second energy level is created by a Group I element other than oxygen, or a Group V element.

Note that hydrogen (H) is effective for creating the first energy level. Despite being a Group I element, hydrogen penetrates the crystals of the MgO interfacially, and therefore is included in the protective layer in a structurally different form to other Group I elements. In other words, hydrogen is an exception among Group I elements in that it can be used to create the first energy level.

Furthermore, Cr is effective for forming the second energy level. Examples of structures using chromium are given in detail in the second and third embodiments.

It is desirable that the respective quantities of the first and second energy levels in the MgO protective layer be approximately the same, or that that of the first energy level is slightly greater.

1-4. Protective Layer (Magnesium Oxide)

Figure 8:
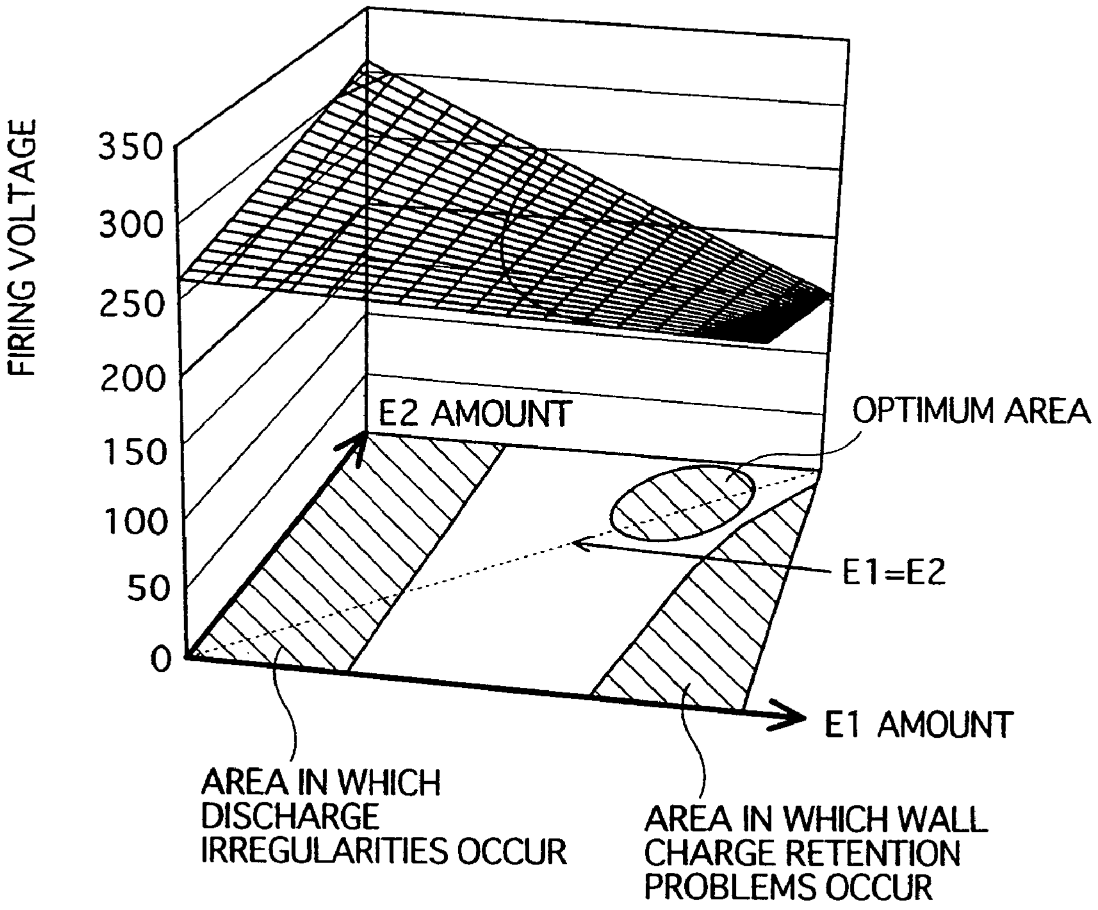
FIG. 8 is for explaining characteristics of the protective layer (magnesium oxide).

FIG. 8 is for describing the properties of the protective layer (magnesium oxide) of the present invention.

As has been described, in the present invention, the magnesium oxide that is the main component of the protective layer has a first energy level (E1) that serves as a donor that supplies electrons in the MgO, and a second energy level (E2) that serves as an acceptor that supplies positive holes in the MgO. The amounts of E1 and E2 give rise to the following properties, as shown in FIG. 8.

Specifically, when E1 exceeds a certain amount, the impedance of the MgO is lowered, and wall charge is unable to be retained. On the other hand, when E1 is below a certain amount, considerable variation occurs in the supply of electrons to the discharge space in discharge initialization. This increases inconsistencies in the timing of firing and consequently causes black noise.

Furthermore, simply increasing the amount of E2 in the MgO leads to an increase in the firing voltage Vf. However, by providing both E1 and E2, the firing voltage Vf can be lowered more effectively. As specifically shown in FIG. 8, if the respective amounts of E1 and E2 are set to be approximately equal and the amount of dopants for creating the energy levels are adjusted appropriately, it is possible to maintain a favorable discharge state in the PDP while also lowering the firing voltage Vf. An optimal range for the respective amounts of E1 and E2 exists as shown in FIG. 8.

The PDP 1 of the first embodiment is manufactured taking this optimal range into account, and is therefore able to lower the firing voltage Vf by about 20% compared to a conventional PDP. In addition, the PDP 1 compares favorably with a conventional PDP in terms of wall charge retention, and does not exhibit black noise.

Figure 7:
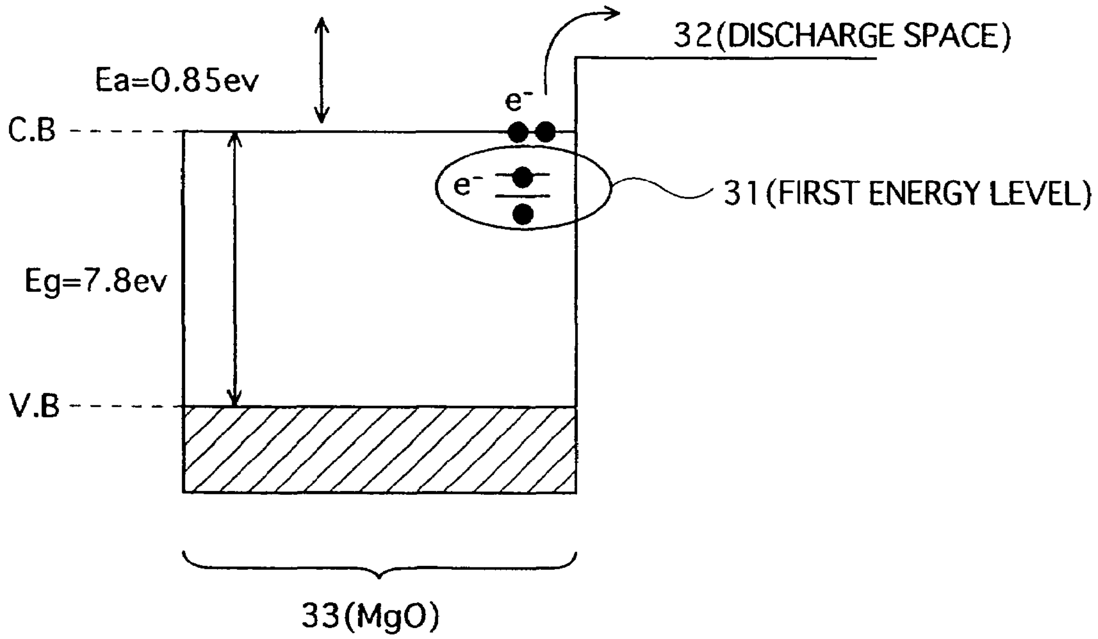
FIG. 7 shows the relationship between the energy state in MgO of a protective layer and a discharge space in the prior art.

In a protective layer made from MgO according to a conventional technique, firing voltage Vf is lowered by, for example, providing a first energy level in a vicinity of the conduction band of the forbidden band of the MgO. As shown in FIG. 7, this causes electrons in the first energy level that are close to the discharge space 24 to be emitted to the discharge space 24 by utilizing energy obtained by a transition shown by an arrow 32. However, the inventors found through experiments that although the firing voltage Vf is lowered, black noise occurs easily with this conventional technique. This is because the insulative properties of the MgO decline in proportion to the increase of electrons in the first energy level 31, and retention of charge, such as wall charge for image display, becomes difficult.

In contrast, the PDP 1 of the first embodiment is able to reduce firing voltage Vf and prevent discharge variations, thereby achieving reliable discharge without use of expensive driver ICs, highly voltage-resistant transistors, and the like, and is able to prevent black noise. In other words, although a conventional technique reduces discharge variations and firing voltage Vf, the ability to retain wall charge is lost because only a first energy level is provided in the protective layer. The resulting problem of image deterioration due to black noise is solved by the present invention.

2. PDP Manufacturing Method

The following describes an example of a method for manufacturing the PDP 1 of the present embodiment. The method described here may also be applied to the PDP 1 of the second and third embodiments described later.

2-1. Front Panel Fabrication

The display electrodes are formed on the surface of the front panel glass, which is soda lime glass that is approximately 2.6 mm thick. In the example given here the display electrodes are formed by a printing method, but another method, such as die-coating or blade coating, may be used.

First, ITO (transparent electrode) material is applied on the front panel glass in a predetermined pattern, and dried. Meanwhile, a photosensitive paste is made by mixing metal (Ag) powder and an organic vehicle together with photosensitive resin (photolytic resin). This photosensitive paste is applied on the transparent electrode material, and covered with a mask in the pattern of the display electrodes to be formed. The photosensitive paste is exposed through the mask, and then developed and fired (at a temperature of approximately 590° C. to 600° C.), resulting in bus lines being formed on the transparent electrodes. This photomask method enables the buslines to be formed with a width of approximately 30 μm. This width is narrow compared to the minimum width of 100 μm achievable with conventional techniques that use screen printing. Note the metal component of the buslines may alternatively be, for example, Pt, Au, Ag, Al, Ni, Cr, tin oxide, or indium oxide.

Another possible method for forming the electrodes is to first form an electrode film by deposition, sputtering or the like, and then use an etching process.

Next, a paste is applied on the formed electrodes. This paste is a mixture of a dielectric glass powder that has a softening point of 550° C. to 600° C., such as a lead oxide or a bismuth oxide, and an organic binder such as butyl carbitol acetate. This is baked at approximately 550° C. to 650° C., thereby forming the dielectric layer.

Next, the protective layer of predetermined thickness is formed on the surface of the dielectric layer using EB deposition. The basic formation process consists of using MgO in a pellet form (average grain diameter 3 mm to 5 mm, purity at least 99.95%) as the source of deposition. If the MgO is to be doped, an appropriate amount of a predetermined element that is the dopant is mixed with the MgO at this stage. Then, reactive EB deposition is performed using a Pierce gun under the following conditions: degree of vacuum $6.5*10^{-3}$ Pa, oxygen flowrate 10 sccm, oxygen partial pressure at least 90%, rate 2 ns/m, and substrate temperature 150° C.).

The following are possible variations of the process for forming the protective layer in the second embodiment. The MgO material is not limited to being in the pellet form described below.

a. An Mg vacancy defect is formed in the MgO crystals by forming the MgO film in an oxygen atmosphere. Next, an oxygen vacancy defect is formed in the MgO crystals according to a short reducing atmosphere process. According these processes, the Mg vacancy defect and the oxygen vacancy defect are made to coexist in the MgO. The oxygen vacancy defect is the first energy level and the Mg vacancy defect is the second energy level. The two processes to form the vacancy defects may be performed in either order. Furthermore, the reducing atmosphere process and the oxygen atmosphere process may be a plasma process including hydrogen and a plasma process including oxygen, respectively, or a heating process including hydrogen and a heating process including oxygen, respectively.

b. The MgO pellets are doped with a Group I element other than hydrogen (H), such as Na, K, Cu, or Ag, or a Group V element such as N (nitrogen), P, As, or Sb. Next, a film formation process, such as a heat process or a plasma process, is performed in a reducing atmosphere. The resulting oxygen vacancy defect creates the first energy level, and the Group I element other than hydrogen (H), or the Group V element creates the second energy level.

c. The MgO pellets are doped with a Group III element such as B, Al, Ga, or In, or a Group IV element, or a Group VII element such as F, Cl, Br or I, and the film formation process is performed in an oxygen atmosphere. The oxygen atmosphere process may be a heating process including oxygen, or a plasma process including oxygen. The Group III element, the Group IV element, or the Group VII element creates the first energy level. Furthermore, an Mg vacancy defect formed according to an oxygen atmosphere process creates the second energy level.

d. The MgO pellets are doped with both (i) a Group VII element, and (ii) either a Group I element other than hydrogen (H) or a Group V element. Then, a film formation process is performed in an oxygen atmosphere. The Group VII element creates the first energy level, and the group I element other than hydrogen (H) or the Group V element creates the second energy level.

e. The MgO pellets are doped with (i) either a Group III element, a Group IV element, or a Group VII element, and (ii) a Group I element other than hydrogen (H) or a Group V element. The Group III, Group IV, or Group VII element creates the first energy level, and the Group I element other than hydrogen (H) or the Group V element creates the second energy level.

Note that there are various methods that can be used to form the protective layer. For example, the film may be formed by an electron beam deposition method or a sputtering method with use of a source and a target that have been doped with impurities. Furthermore, if Cr is to be included in the MgO, the MgO may be doped with the Cr according to a doping process or a plasma process after the film formation process.

In the second embodiment, if the MgO is to be doped with Cr, an appropriate amount of Cr in order to maintain crystallization of the protective layer is $1E18/cm^3$ or less. Note that if Si or H is used as the dopant, at least $1E16/cm^3$ is necessary.

Note also that the effects of the present invention can be obtained to an extant as long as the protective layer is doped in at least the areas corresponding to the display electrodes. An example of a method that can be used if only specific areas of the protective layer are to be doped is to form a patterning mask on the surface of a partially formed MgO film, and then perform plasma doping.

Furthermore, the protective layer may be formed using another method such as CVD (chemical vapor disposition).

This completes the front panel.

2-2. Back Panel Fabrication

A conductive material having Ag as a main component is applied by screen printing in stripes with set intervals therebetween on the surface of the back panel glass, which is soda lime glass that is approximately 2.6 mm thick, thereby forming 5 μm-thick address electrodes. If, for example, the PDP 1 is to be a 40-inch NTSC or VGA PDP, the interval between the address electrodes is 0.4 mm or less.

Next, a lead glass paste is applied over the whole surface of the back panel to cover the address electrodes, with a thickness of 20 μm to 30 μm, and baked to form the dielectric layer.

Barrier ribs of approximately 60 μm to 100 μm in height are formed on the dielectric layer in the gaps between the address electrodes using the same kind of lead glass as was used for the dielectric layer. The barrier ribs are formed, for example, by repeatedly screen printing paste that includes the glass material, and then baking. Note that in the present invention it is desirable for the lead glass material that forms the barrier ribs to include an Si component because Si improves the effect of controlling the impedance of the protective layer. The glass may be doped with Si even if an Si component is included in the chemical composition of the glass. Furthermore, the glass may be doped with an appropriate amount of an impurity that has a high vapor pressure (N, H, Cl, F, etc), in a gas form in the vapor during the MgO film formation process.

After the barrier ribs have been formed, phosphor ink that includes either red (R) phosphor, green (G) phosphor, or blue (B) phosphor is applied to the surface of the dielectric film on the exposed areas between the barrier ribs, and on the surfaces of the wall of the barrier ribs. This is baked and dried, thereby forming the phosphor layers.

The following is an example of the chemical composition of the R, G, and B phosphors.

| | |
|---|---|
| Red Phosphor: | $Y_2O_3:Eu^{3+}$ |
| Green Phosphor: | $Zn_2SiO_4:Mn$ |
| Blue Phosphor: | $BaMgAl_{10}O_{17}:Eu^{2+}$ |

Each of the phosphor materials has an average grain size of 2.0 μm. The phosphor materials are put into a server with a 50% mass ratio, together with ethylcellulose with a 1% mass ratio, and a solvent (α-terpineol) with a 49% mass ratio, and mixed in a sandmill, thereby producing $15*10^{-3}$ Pa·s phosphor ink. The phosphor ink is injected between the barrier ribs 20 by a pump having a nozzle with a diameter of 60 μm, while the panel is made to travel in the lengthwise direction of the barrier ribs in order to apply the phosphor ink in stripes. Next, the panel on which the phosphor ink has been applied is baked for 10minutes at 500° C., thereby forming the phosphor layers 21 to 23.

This completes the back panel.

Note that the front panel and the back panel are not limited to being made of soda lime glass as given as an example, but may be made of another material.

2-3. Completion of the PDP

The fabricated front panel and back panel are sealed together using sealing glass. The resulting discharge space is evacuated to a high vacuum of approximately $1.0*10^{-4}$ Pa, and then filled with a discharge gas such as Ne—Xe, He—Ne—Xe, or He—Ne—Xe—Ar with a predetermined pressure (here, 66.5 kPa to 101 kPa).

This completes the PDP 1.

3. Second Embodiment 3-1. Structure of the PDP

The overall structure of the PDP 1 of the second embodiment is almost the same as that of the first embodiment, and is characterized by the protective layer 15.

Specifically, the main characteristic of the PDP 1 of the second embodiment is that the MgO crystals that make up the protective layer 15 are doped with a metal element Cr from the surface of the protective layer 15 extending for a depth of at least 100 nm, with a density of concentration of $1E18/cm^3$. In addition, the MgO crystals have a structure that includes an oxygen vacancy defect.

According to this structure, the first energy level is created in the forbidden band of the MgO of the protective layer 15 by the oxygen vacancy defect, and the second energy level is created in the forbidden band by the Cr. This achieves substantially the same effects as the first embodiment.

Additionally, in the second embodiment the Cr used as a dopant works as luminescent centers during driving of the PDP 1, and controls impedance of the protective layer. Consequently, discharge probability of address discharge and the like is improved, and the PDP 1 exhibits superior image display characteristics. Note that it is sufficient for the Cr to be doped in areas of the protective layer 15 that correspond to the positions of the display electrodes 12 and 13, instead of the being doped across the whole protective layer 15. The effects of this structure are described in detail later. Furthermore, although Cr is given as an example of a dopant that controls the impedance of the protective layer 15, another element that achieves the same effect may be used. Examples of such elements are transition elements such as Mn and Fe, and rare earth elements such as Eu, Yb, and Sm.

3-2. Effects of the Second Embodiment

While it is desirable to use a material that is sputter resistant and has superior secondary electron discharge characteristics for the protective layer 15, it is a condition that the material is able to favorably maintain discharge during driving of the PDP 1, as well as sustaining the carrier concentration of the protective layer 15 so as to control changes in impedance in order that discharge occurs easily in the discharge space 24. If the material fulfills these conditions, the discharge probability of address discharge and the like during driving can be increased, and favorable image display performance can be obtained even in high-speed driving that accompanies high definition.

The second embodiment realizes substantially the same effects as the first embodiment by providing an oxygen vacancy defect in the MgO crystals of the protective layer in order to ensure the first energy level, and by creating the second energy level using a doping material other than Si (here, Cr is used). The inventors of the present invention chose to use Cr as the dopant for controlling the impedance of the protective layer 15 after finding that Cr in the MgO crystals works as luminescent centers. Specifically, the inventors found that if MgO is doped with Cr, a phenomenon occurs in which the Cr generates a broad emission spectrum with a wavelength in the vicinity of 700 nm. Note that detailed analysis of the properties of MgO doped with impurities can be found in C. C. Chao, J. Phys. Chem. Solids 32 2517 (1971) and M. Maghrabi et al NIM B191 (2002) 181.

The second embodiment came about by focusing on the fact that the discharge probability during driving of the PDP 1 changes depending on the conditions of the protective layer that contacts the discharge space, specifically, the structure, diameter and orientation of the MgO crystals, and the impurities that are intermixed with the crystals.

By using Cr in this way, the first energy level is created in the forbidden band of the MgO of the protective layer according to the oxygen vacancy defect, and the second energy level is created according to the Cr. As a result, the same effects as the first embodiment can be achieved when the PDP 1 is driven.

In addition, electrons in the protective layer 15 are excited by irradiation of VUV caused by sustain discharge, initialization discharge and the like, and visible light with a long wavelength of approximately 700 nm is emitted from the luminescent centers which are Cr. At this time, there are electrons in the protective layer 15 that transition to the luminescent centers, as well as electrons that are excited to the energy level in a vicinity of the conduction band. Due to these excited electrons, the carrier concentration of the protective layer 15 is improved, and the impedance of the protective layer 15 is controlled. Furthermore, as the number of electrons excited to near the conduction band due to visible like emission increases, the discharge probability of the PDP 1 increases, and therefore the PDP 1 exhibits superior image display characteristics. For these reasons, even if Cr is used instead of Si, the discharge probability of address discharge and the like increases. Furthermore, there is greater freedom in selecting materials at the time of manufacturing.

Another technique for forming luminescent centers in the MgO of the protective layer is to use an oxygen vacancy defect (an Mg-rich composition) in the protective layer. Visible light having a wavelength of approximately 400 nm to 600 nm can be obtained with the oxygen vacancy defect. As when Cr is used as a dopant, in this case electrons are exited to the conduction band level in the MgO when visible light is emitted, thereby improving the carrier concentration of the protective layer. As a result, the described effects can be obtained.

Figure 4:
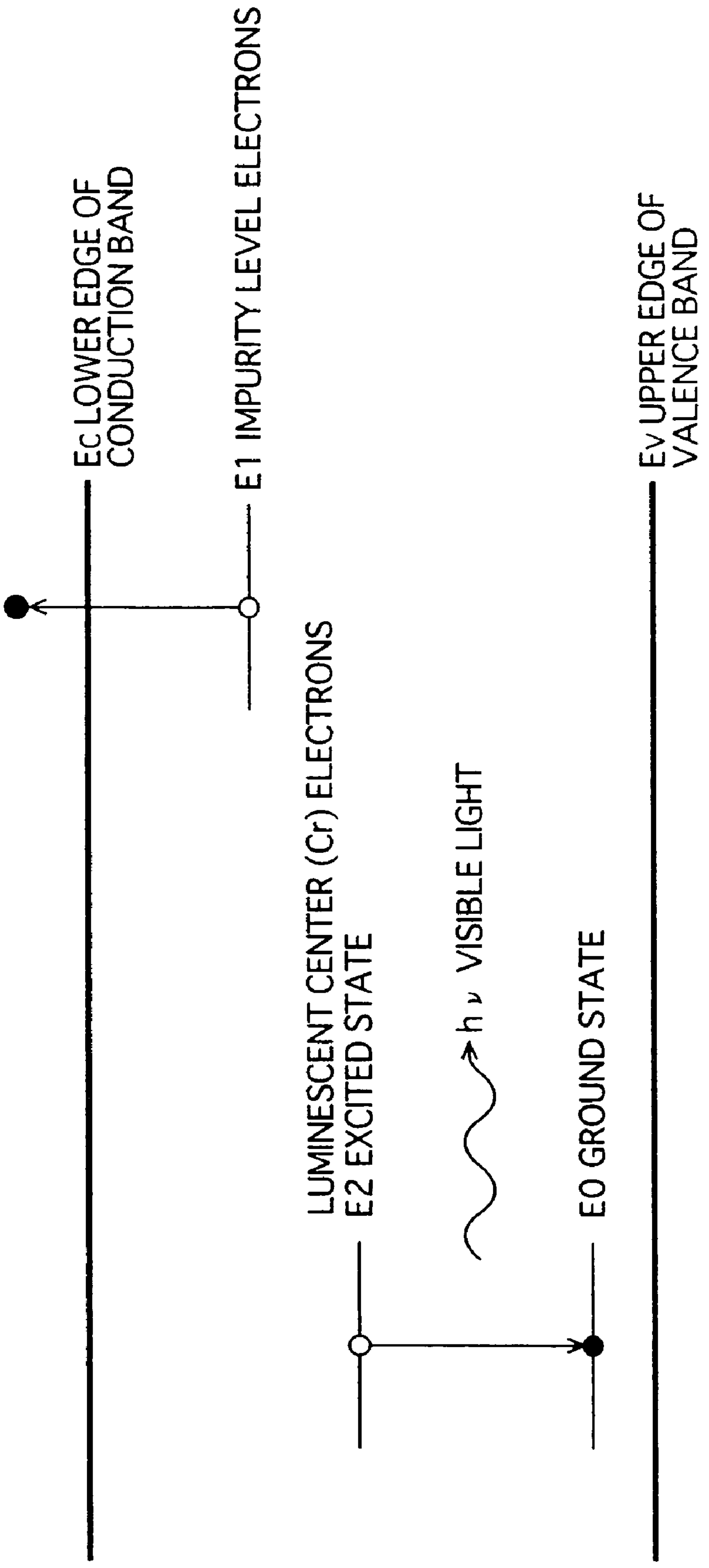
FIG. 4 is an energy band diagram of a protective layer doped with Cr in a PDP of a second embodiment.

Here, FIG. 4 shows the energy bands of the MgO protective layer 15 of the second embodiment doped with Cr. Ec shows the lower edge of the conduction band, and Ev shows the upper edge of the valence band. As shown in FIG. 4, during driving of the PDP 1, in the initialization period for example, when the pairs of display electrodes 12 and 13 are supplied with electricity and a positive pulse with a down-ramp waveform is applied to the scan electrodes 12, the discharge gas is excited, and plasma (initialization discharge) occurs in the discharge space 24. Then, due to ultraviolet rays from the plasma, the electrons in the MgO of the protective layer 15 become excited (E0 to E2). When the electrons are excited, visible light having a wave length of approximately 700 nm is generated due to the difference in energy between E2 and E0. At this time, E2 works as the second energy level. Accompanying light emission is the occurrence of electrons in the protective layer 15 being excited to an impurity level (capture level), which is the first energy level that is in a vicinity of the conduction band.

Due to the electrons being excited to the impurity level in a vicinity of the conduction band in this process, the carrier concentration of the protective layer 15 is improved, and the impedance of the protective layer 15 is controlled. As a result, discharge probability is increased in both the address period and the discharge sustain period following the initialization period, and the PDP 1 exhibits favorable image display performance. Furthermore, since, address discharge (write discharge) can be performed reliably in high-speed driving for high definition display due to the increase in discharge probability, the PDP 1 exhibits favorable image display. Consequently, high-speed driving can be achieved without increasing the number of data driver ICs to use dual scanning. In other words, high-speed driving can be achieved at low cost.

Note that the effects of the second embodiment are exhibited favorably in the periods from the initialization period through to the address discharge period (in other words, the period in which black noise occurs most easily), however, the second embodiment is also effective in achieving favorable sustain discharge in the discharge sustain period.

Additionally, depending on the structure, in some PDPs there are cases in which the Si included in compositional elements of the PDP impregnates the protective layer via the discharge space and causes the impedance of the protective layer to change over time. However, the second embodiment also has the advantage of avoiding this problem due to the use of Cr.

4. Third Embodiment

Figure 5:
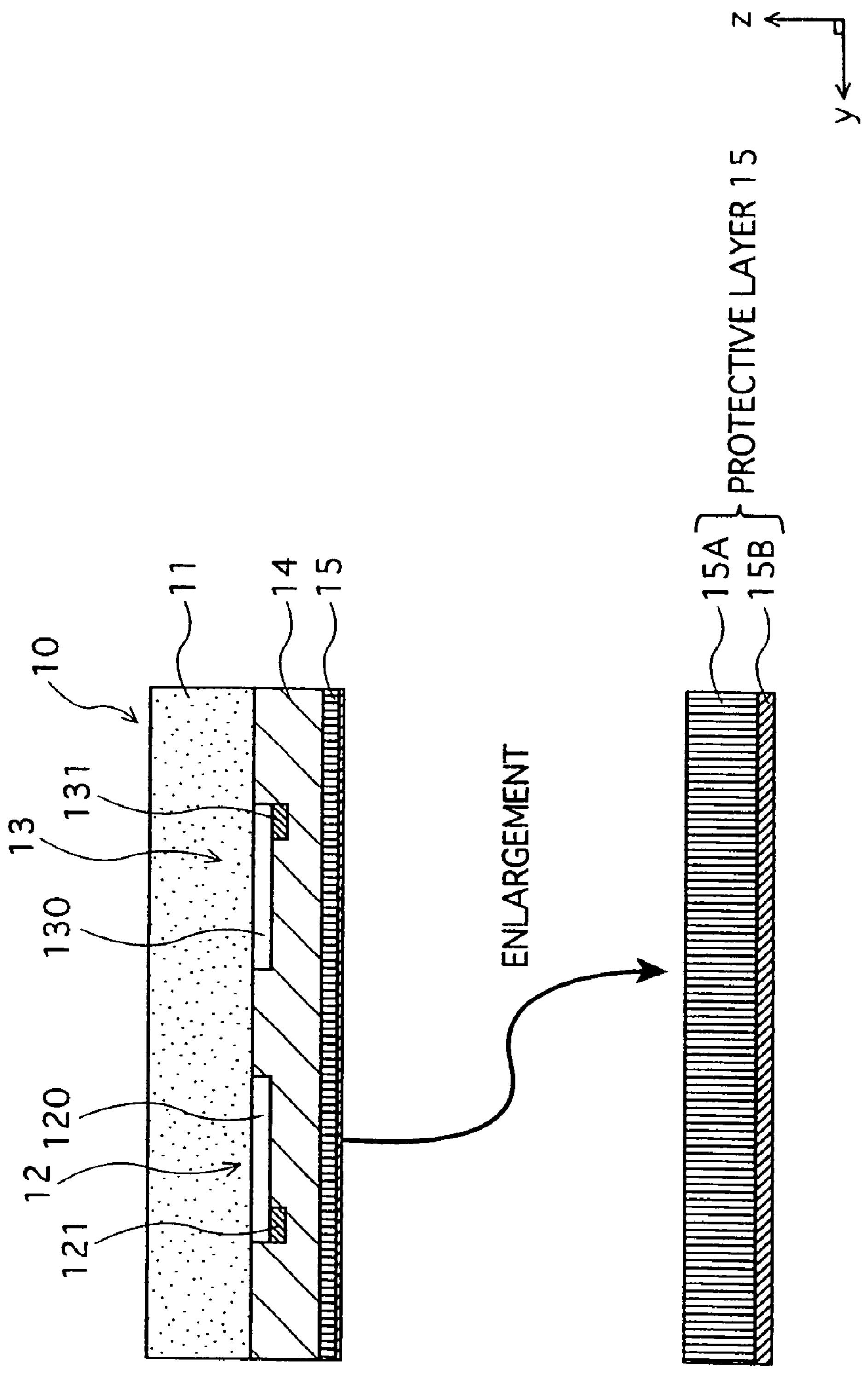
FIG. 5 is a cross-sectional diagram of the structure of a protective layer of a PDP of the third embodiment.

FIG. 5 is a partial cross-sectional diagram of the structure of the protective layer 15 of the PDP 1 of the third embodiment. As shown in FIG. 5, the protective layer 15 of the third embodiment is composed of two layers 15A and 15B, of which the protective layer 15A, which is made of MgO that is approximately 100 nm thick, is doped at the surface with Cr and has an oxygen vacancy defect. In this structure also, the oxygen vacancy defect creates the first energy level and the Cr creates the second energy level. In this way, in the present invention, the protective layer 15 is not limited to having uniform qualities in the thickness direction. The effects of the present invention can be obtained as long as first and second energy levels are created at least in a vicinity of the surface of the protective layer 15. The thickness of approximately 100 nm is selected so as to be greater than the thickness thought to be required considering wear of the protective layer when the PDP is illuminated in an ordinary lifespan. If the protective layer 15A is of this thickness, the effects are sustained throughout normal use of the PDP 1.

Note that the two-layer structure of the protective layer 15 may be formed by using an EB (electron beam) method or a sputter method. Here, the protective layer 15B is first formed using a pure MgO source and target, and then the protective layer 15A is formed using an MgO material that includes Cr. Alternatively, the protective layer 15 may be first formed from only MgO, and then the surface of the protective layer may be processed according to a plasma doping method or the like.

5. Other

Although examples are given in the second and third embodiments of the Cr being doped into MgO of the protective layer that has an oxygen vacancy defect, the present invention is not limited to this structure. The effects of the present invention can be further heightened by doping the MgO with hydrogen (H) in addition to Cr. If the MgO is doped with Cr and H, the described effects of the Cr are obtained, specifically, broad visible light of approximately 700 nm is obtained, and electrons are excited to near the conduction band, thereby improving carrier concentration of the protective layer 15. Furthermore, the H diffuses in the oxygen vacancy defect of the MgO, enters a monovalent negative ion state, and forms a donor-like impurity level is formed neat the lower edge of the conduction band. The hydrogen works as a reserver of electrons excited to the impurity level, and therefore the lifespan of the visible light lengthens, and the carrier concentration of the protective layer 15 further improves. Note that detailed analysis of the property of MgO doped with impurities can be found in G. H. Rosenblatt et al. Phys. Rev. B39 (1989) 10309. Doping the MgO of the protective layer 15 with hydrogen (H) in addition to Cr increases discharge probability as in the second and third embodiments, and obtains favorable image display performance because of the aforementioned effects.

Furthermore, an alternative structure of the protective layer 15 in the present invention is one in which an oxygen vacancy defect is formed using Mg-rich MgO, and doped with Si as impurities. According to this structure, luminescent centers are formed with the oxygen vacancy defect in the MgO of the protective layer, and, electrons are consequently excited to near the conduction layer. Since the Si works as a reserver for the excited electrons, the lifespan of the visible light is lengthened, and the carrier concentration of the protective layer is improved. As a result, the impedance of the protective layer is controlled, and the same effects as the second and third embodiments are achieved.

Figure 6:
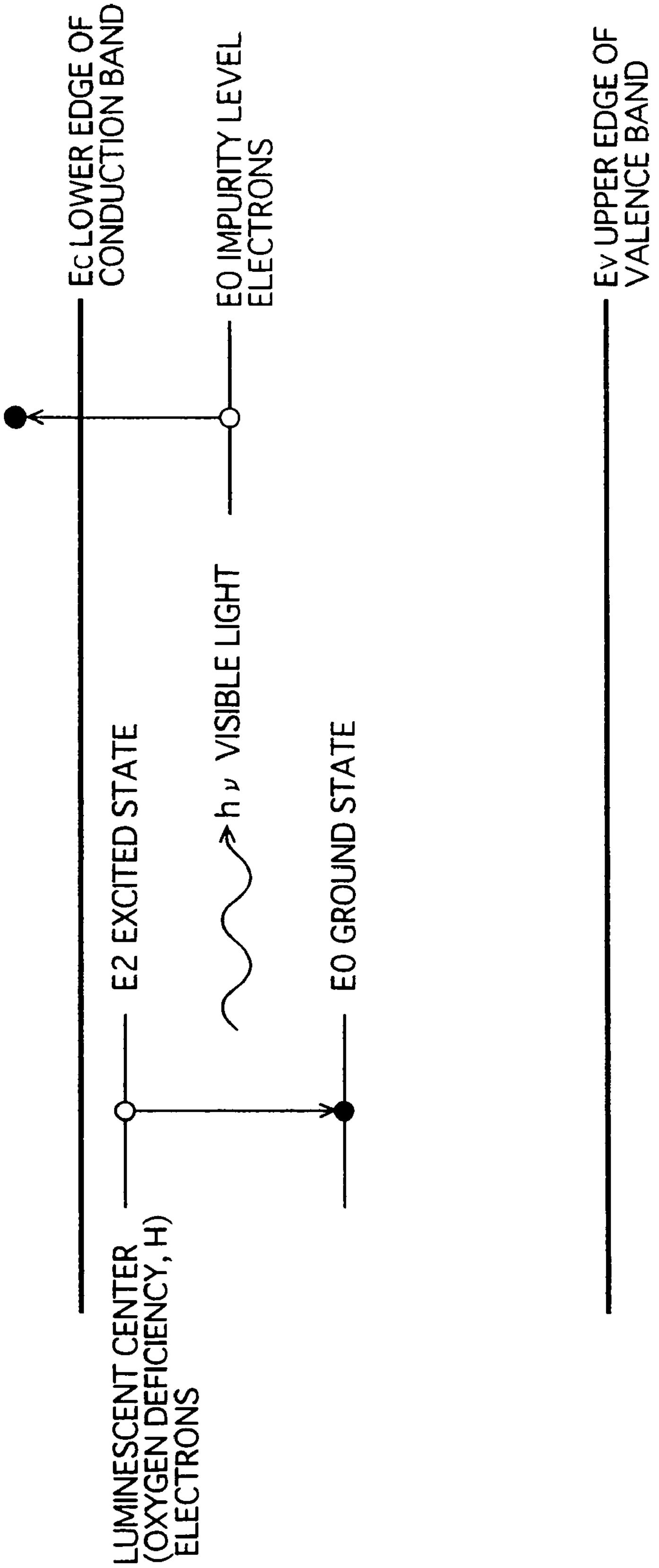
FIG. 6 is an energy band diagram of a protective layer that has an oxygen vacancy defect, or that has been doped with H.

Yet another example of a alternative structure of the protective layer 15 is one in which Mg-rich MgO used for the protective layer is doped with H impurities. According to the stated structure, during driving of the PDP 1 visible light is generated in the oxygen vacancy defect included in the MgO of the protective layer 15, as shown in FIG. 6. Accompanying this visible light, electrons are excited to the near conduction band of the MgO in the protective layer 15. The hydrogen works as an operator for the excited electrons, and the lifespan of the visible light is lengthened. As a result, the same effects as the second and third embodiments are obtained. Here, favorable effects can also be obtained if Cr is used to dope the Mg-rich MgO, since this increases the number of luminescent centers. Furthermore, since both the oxygen vacancy defect and Cr exist as the luminescent centers in this case, there is an added advantage that impedance of the protective layer can be more freely controlled.

Furthermore, the effects of the present invention are particularly high when oxygen-rich MgO is used in the protective layer 15. When the MgO is oxygen-rich, the oxygen vacancy concentration is low and there are very few luminescent centers, and therefore very little light is emitted after initial discharge. If Cr and the like are doped into the MgO as in the present invention, the number of luminescent centers increases, and therefore the carrier concentration of the protective layer increases favorably. As a result, discharge irregularities decrease remarkably.

Furthermore, in the present invention the protective layer 15 may have a structure in which oxygen-rich MgO is doped with Cr and H. Since there are few luminescent centers in oxygen-rich MgO, doping with Cr and H remarkably increases light emission from the luminescent centers after initialization discharge and the amount of secondary electrons discharged. Therefore, the same kind effects as the second and third embodiments can be obtained favorably.

Furthermore, in the present invention the protective layer 15 may have a structure in which oxygen-rich MgO is doped with Cr and Si. This structure also obtains the same kind of effects as when the oxygen-rich MgO is doped with Cr and H, as described above.

Note that with any of the structures in which one or more of Cr, Si, and H is used as a dopant in oxygen-rich MgO or Mg-rich MgO, it is not necessary for the whole of the protective layer to have such a structure. It is sufficient for the protective layer 15 to have such a structure from the surface extending for a depth of least 100 nm from the surface to obtain the effects of the present invention.

Although the present invention has been fully described by way of examples with reference to accompanying drawings, it is to be noted that various changes and modifications will be apparent to those skilled in the art. Therefore, unless such changes and modifications depart from the scope of the present invention, they should be construed as being included therein.

What is claimed is:

1. A plasma display panel manufacturing method in which a protective layer forming procedure for forming a protective layer on a surface of a substrate is performed, the method comprising:

in the protective layer forming procedure, a forming step of forming the protected layer from magnesium oxide;

a step of subjecting the protective layer to one of (a) a heating process in an atmosphere that includes oxygen and (b) a plasma discharge process in an atmosphere that includes oxygen; and a step of subjecting the protective layer to one of (a) a heating process in an atmosphere that includes hydrogen, and (b) a plasma discharge in an atmosphere that includes hydrogen, wherein the forming step includes composing the protective layer principally of magnesium oxide and including a substance or a structure that enables a creation of a first energy level in an area of a forbidden band, the area being in a vicinity of a conduction band, and includes a substance or a structure that enables a creation of a second energy level in another area in the forbidden band, the other area being in a vicinity of a valence band.

2. A plasma display panel manufacturing method in which a protective layer forming procedure for forming a protective layer on a surface of a substrate is performed, the method comprising:

in the protective layer forming procedure, a forming step of forming the protective layer from magnesium oxide, and by doping the magnesium oxide with one of a Group III element, a Group IV element, and a Group VII element; and a processing step of subjecting the protecting layer to one of a heating process in an atmosphere that includes oxygen and a plasma process in an atmosphere that includes oxygen, wherein the forming step includes composing the protective layer principally of magnesium oxide and including a substance or a structure that enables a creation of a first energy level in an area of a forbidden band, the area being in a vicinity of a conduction band, and includes a substance or a structure that enables a creation of a second energy level in another area in the forbidden band, the other area being in a vicinity of a valence band.

3. The plasma display panel manufacturing method of claim 1 wherein the second energy level is created by a magnesium vacancy defect.

4. The plasma display panel manufacturing method of claim wherein a second energy level is created by a magnesium vacancy defect.

5. The plasma display panel manufacturing method of claim 2 wherein the protective layer is doped with chrome.

6. The plasma display panel manufacturing method of claim 2, wherein the one of the Group III element, the Group IV element, and the Group VII element creates the first energy level, and an Mg vacancy defect creates the second energy level.

7. The plasma display panel manufacturing method of claim 6, wherein the protective layer is oxygen-rich and doped with chrome in a part extending for a depth of at least 100 nm starting from a surface of the protective layer that will face a discharge space.

* * * * *

UNITED STATES PATENT AND TRADEMARK OFFICE

CERTIFICATE OF CORRECTION

PATENT NO. : 7,504,126 B2
APPLICATION NO. : 11/486185
DATED : March 17, 2009
INVENTOR(S) : Nishitani et al.

It is certified that error appears in the above-identified patent and that said Letters Patent is hereby corrected as shown below:

In the Claims:
Claim 1, Column 16, line 12, "oxygen" should include a comma --oxygen,--;
Claim 4, Column 16, line 50, "claim" should read --claim 2--.

Signed and Sealed this

Twenty-second Day of September, 2009

David J. Kappos

David J. Kappos
*Director of the United States Patent and Trademark Office*